United States Patent [19]
Inui et al.

[11] Patent Number: 5,995,431
[45] Date of Patent: Nov. 30, 1999

[54] BIT LINE PRECHARGE CIRCUIT WITH REDUCED STANDBY CURRENT

[75] Inventors: Takashi Inui, Tokyo; Masahide Matsumoto, Akishima; Kiyotaka Okuzawa, Tsukuba, all of Japan

[73] Assignee: Texas Instruments Incorporated, Dallas, Tex.

[21] Appl. No.: 09/095,431

[22] Filed: Jun. 10, 1998

[51] Int. Cl.[6] .................................................. G11C 7/00
[52] U.S. Cl. ...................... 365/203; 365/149; 365/189.11
[58] Field of Search .................................... 365/203, 149, 365/189.11

[56] References Cited

U.S. PATENT DOCUMENTS

| | | | |
|---|---|---|---|
| 5,612,912 | 3/1997 | Gillingham | 365/203 |
| 5,666,318 | 9/1997 | Takai | 365/203 |
| 5,710,738 | 1/1998 | Tai | 365/203 |
| 5,761,123 | 6/1998 | Kim et al. | 365/203 |

Primary Examiner—Son T. Dinh
Attorney, Agent, or Firm—Robert N. Rountree; Robby T. Holland; Richard L. Donaldson

[57] ABSTRACT

A circuit is designed with a memory array (102) having a plurality of memory cells arranged in rows and columns (204, 206, 210, 212). The memory array has a plurality of bit line pairs (202, 208, 282, 284) with each bit line pair connected to a respective column of memory cells and a bit line reference terminal (254). A control circuit (700) produces a control signal, the control signal having a first voltage for a first time, a second voltage for a second time and a third voltage for a third time. A precharge circuit (350, 352) connects at least one bit line pair to the bit line reference terminal, responsive to the first voltage for the first time and the second voltage for the second time. The precharge circuit disconnects the at least one bit line pair from the bit line reference terminal, responsive to the third voltage for the third time.

11 Claims, 5 Drawing Sheets

BIT LINE PRECHARGE CIRCUIT WITH REDUCED STANDBY CURRENT

FIELD OF THE INVENTION

This invention relates to an integrated circuit and more particularly to an integrated circuit with reduced standby current in a bit line precharge circuit.

BACKGROUND OF THE INVENTION

Present complementary metal oxide semiconductor (CMOS) synchronous dynamic random access memory (SDRAM) circuits are frequently used for main memory in a variety of applications including desk top and portable computer systems. Advances in manufacturing technology have greatly improved the process and reduced the defect density associated with these memory circuits. With continued reductions in memory circuit feature sizes, however, some defects in memory circuits are unavoidable. Memory manufacturers frequently incorporate redundancy circuits to repair faulty rows, columns and bits that result from these unavoidable defects. Redundant repair of faulty memory elements produces a memory circuit with all memory cells fully functional but it does not remove the original defect.

Some of these defects may still compromise functionality of the memory circuit even after redundant repair. A short circuit between adjacent word lines, for example, may cause an increase in current consumption when one of the word lines is driven high and the other is held low during an active part of a memory cycle. Repair of such a defect may require replacement of both word lines. A more serious problem occurs when a word fine is shorted to a bit line. Replacement of the word line and bit line may restore functionality, but current consumption may still be unacceptable for two reasons. First, the bit line is frequently precharged to a bit line reference voltage (BLR) intermediate the supply voltage (Vdd) and ground (Vss) during a standby part of the memory cycle. Current consumption is limited by product specification to a value far below that of the active part of the memory cycle during this standby part of the memory cycle. Thus, the word line to bit line short will frequently exceed product specification.

Second, bit lines are perpetually precharged during the standby part of the memory cycle. A constant current, therefore, is perpetually consumed by the memory circuit even though the memory circuit may not be accessed for extended periods. Maximum allowable standby current for a memory circuit is often specified as an average current. This average current consumption is increased due to a word line to bit line short for the duration of the standby part of the memory cycle. Thus, current consumption due to the word line to bit line short frequently exceeds the maximum allowable standby current specification and renders the memory circuit unrepairable.

SUMMARY OF THE INVENTION

These problems are resolved by a circuit comprising a memory array having a plurality of memory cells arranged in rows and columns. Each of a plurality of bit line pairs is connected to a respective column of memory cells. A control circuit produces a control signal having a first voltage for a first time, a second voltage for a second time and a third voltage for a third time. A precharge circuit connects at least one bit line pair to the bit line reference terminal, responsive to the first voltage for the first time and the second voltage for the second time. The precharge circuit disconnects the at least one bit line pair from the bit line reference terminal, responsive to the third voltage for the third time.

The present invention provides a first voltage for a first time to precharge a bit line pair. A second voltage for a second time limits current flow through the precharge circuit. A third voltage for a third time disables the precharge circuit during an active part of a memory cycle.

BRIEF DESCRIPTION OF THE DRAWINGS

A more complete understanding of the invention may be gained by reading the subsequent detailed description with reference to the drawings wherein:

FIG. 1 is a block diagram of a memory device which may employ the present invention;

DETAILED DESCRIPTION OF THE PREFERRED EMBODIMENTS

Figure 1:
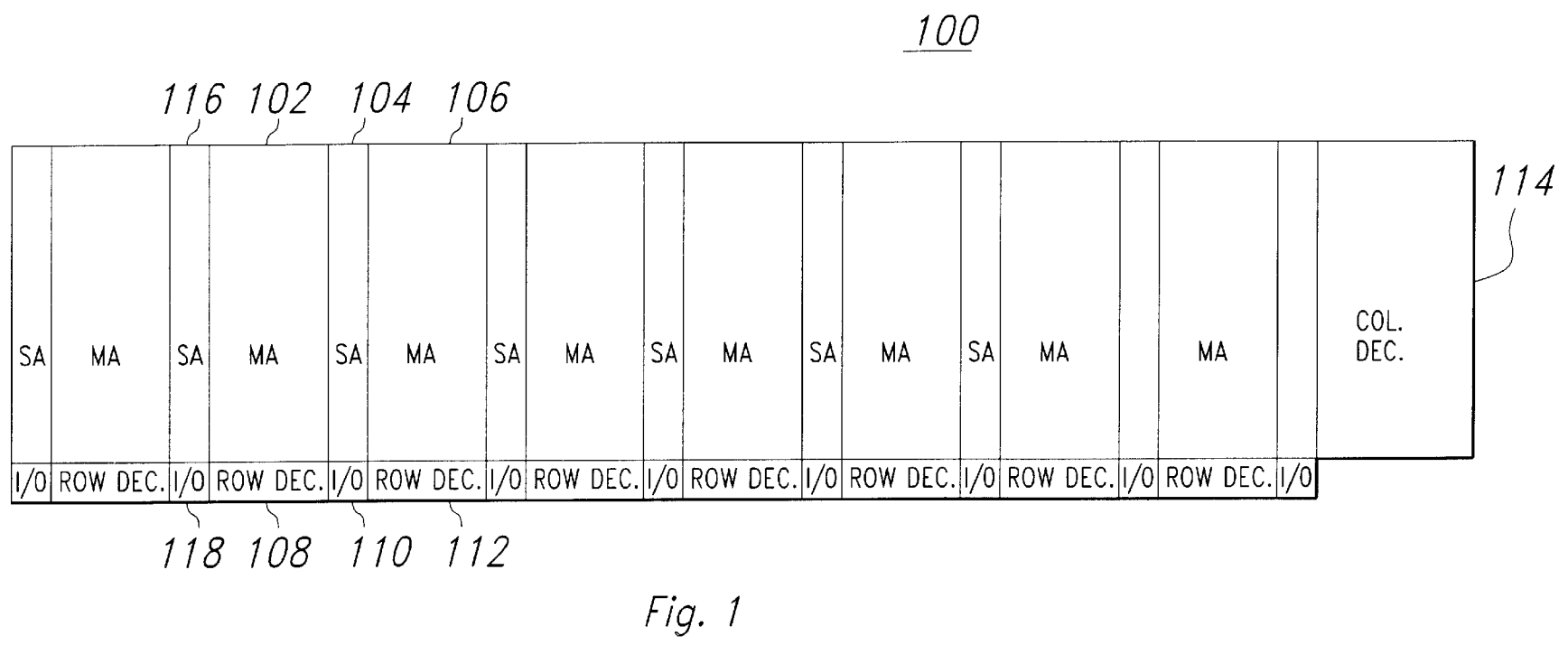

Referring now to FIG. 1, a memory circuit will be described in detail. Memory circuit 100, including related circuitry, represents a basic block that may be partially replicated to produce a desired memory size. For example, memory circuit 100 includes memory array 102, organized in 256 rows and 1024 columns. Thus, memory array 102 would be repeated sixty-four times to produce a 16 megabit dynamic random access memory.

Figure 5:
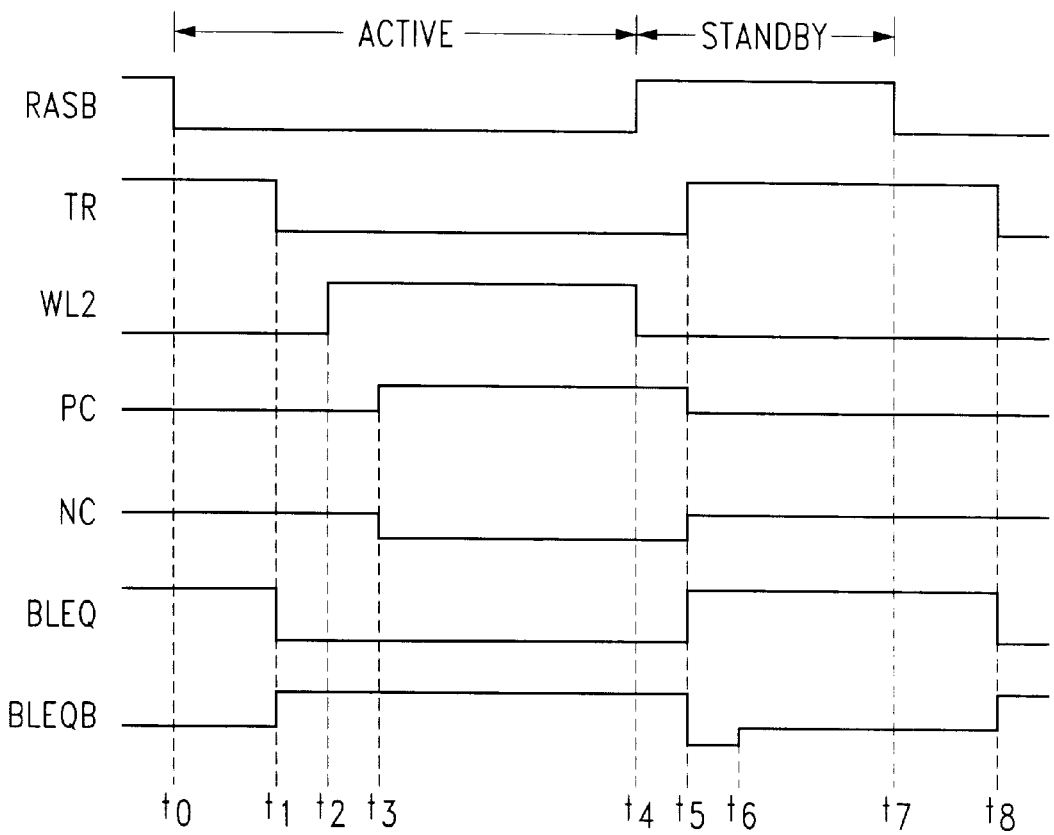
FIG. 5 is a timing diagram of a memory cycle of a memory circuit of the present invention.

An active part of a memory cycle begins when row address strobe control signal RASB goes low (FIG. 5). A row of memory cells in array 102 is selected when row decoder 108 selectively activates 1 of 256 word lines in response to a row address (FIG. 1). Sense amplifier banks 116 and 104 then amplify data from the 1024 corresponding columns of memory cells. Column decoder circuit 114 selects sense amplifiers from banks 116 and 104 in response to a column address. Data from the selected sense amplifiers flows to I/O circuits 118 and 110, respectively. Data from these I/O circuits is applied to a data bus (not shown) and selectively routed to an output or I/O terminal (not shown). The active part of the memory cycle ends, and a standby part of the memory cycle begins when control signal RASB goes high (FIG. 5). The 1 of 256 word lines in array 102 is driven low by row decoder 108 to store refreshed data in all memory cells of the previously activated row. Bit line pairs coupled to respective sense amplifiers in banks 116 and 104 are then equalized and precharged.

Figure 2:
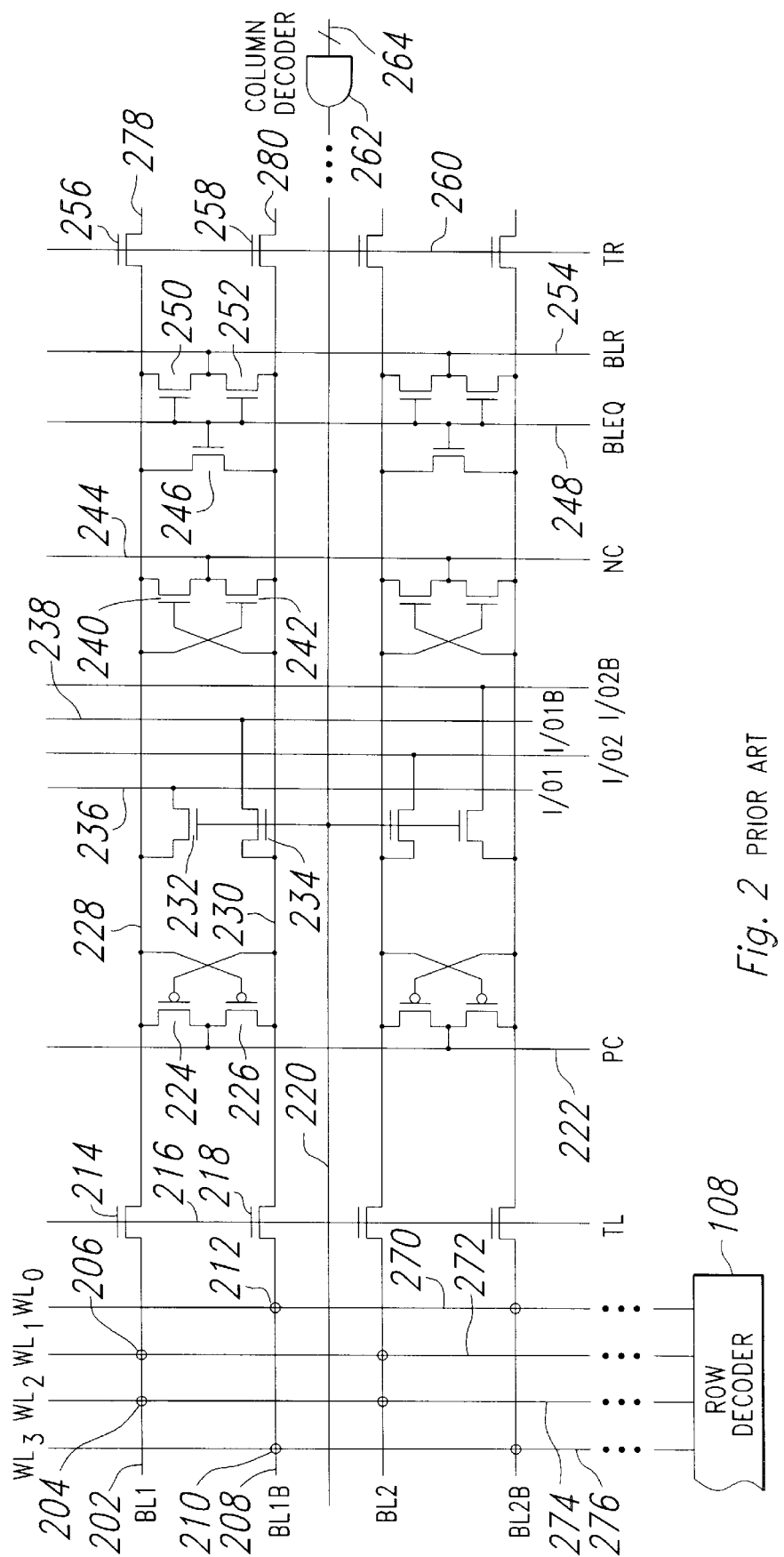
FIG. 2 is a schematic diagram of a sense amplifier circuit including a precharge circuit of the prior art.

Referring now to FIG. 2, there is a schematic diagram of two sense amplifiers, their respective bit line pairs and a precharge circuit of the prior art. A memory cycle begins when a selected word line WL2 at 274, for example, couples a datum from memory cell 204 to bit line BL1 at 202. Since there is no corresponding memory cell at the intersection of bit line BL1B at 208 and word line WL2, a difference voltage representing the datum is developed on bit line pair BL1 and BL1B. This difference voltage is coupled to the upper sense amplifier through transistors 214 and 218 in response to a high level of address signal TL on line 216. The upper sense amplifier includes P-channel transistors 224 and 226 arranged in a cross-coupled configuration for driving one of BL1 or BL1B high in response to control signal PC on line 222. One of cross-coupled N-channel transistors 240 and 242 drives the other of BL1 202 or BL1B 208 low in response to control signal NC on line 244. Column decoder 262 produces a column select signal on line 220 in response to an address signal on bus 264 during the memory cycle. Data is then coupled to complementary I/O lines I/O1 at 236 and I/O1B at 238 through select transistors 232 and 234 in response to the column select signal on line 220.

The active part of the memory cycle concludes when external control signal RASB (FIG. 5) goes high. Word line WL2 is driven low to store a refreshed datum in memory cell 204. The sense amplifier is disabled by control signals PC and NC. Furthermore, unselected bit line pair 278 and 280 is coupled to the upper sense amplifier by address signal TR (FIG. 2). A high level of control signal BLEQ activates transistor 246 to equalize sense terminals 228 and 230 as well as corresponding bit lines at 202, 208, 278 and 280. These bit lines are precharged to bit line reference voltage BLR at 254 by N-channel transistors 250 and 252. This bit line reference voltage BLR is intermediate supply voltage Vdd and reference voltage Vss and preferably one half of supply voltage Vdd. According to this precharge circuit of the prior art, sense nodes and bit lines are perpetually precharged to bit line reference voltage BLR for the standby part of the memory cycle. Consequently, a word line to bit line short at memory cell 204 will establish a current path from bit line reference voltage BLR at 254 through transistors 250 and 214 to ground through word line WL2 at 274 and row decoder 108.

This current path remains when word line WL2 is repaired by a redundant word line, because the word line to bit line short remains in the circuit even if the redundant word line is activated in lieu of word line WL2. Moreover, transistors 214 and 250 have control gates driven to supply voltage Vdd and sources at no more than the bit line reference voltage BLR during precharge. Transistors 214 and 250 are highly conductive, therefore, with gate-to-source voltages of at least one half of supply voltage Vdd. Thus, current flow is limited primarily by the conductivity of the word line to bit line short. Current flow through this shorted current path is significant compared to normal current consumption of the memory circuit during standby, and the memory circuit may be unrepairable due to an increase in standby current ICC2.

Figure 3:
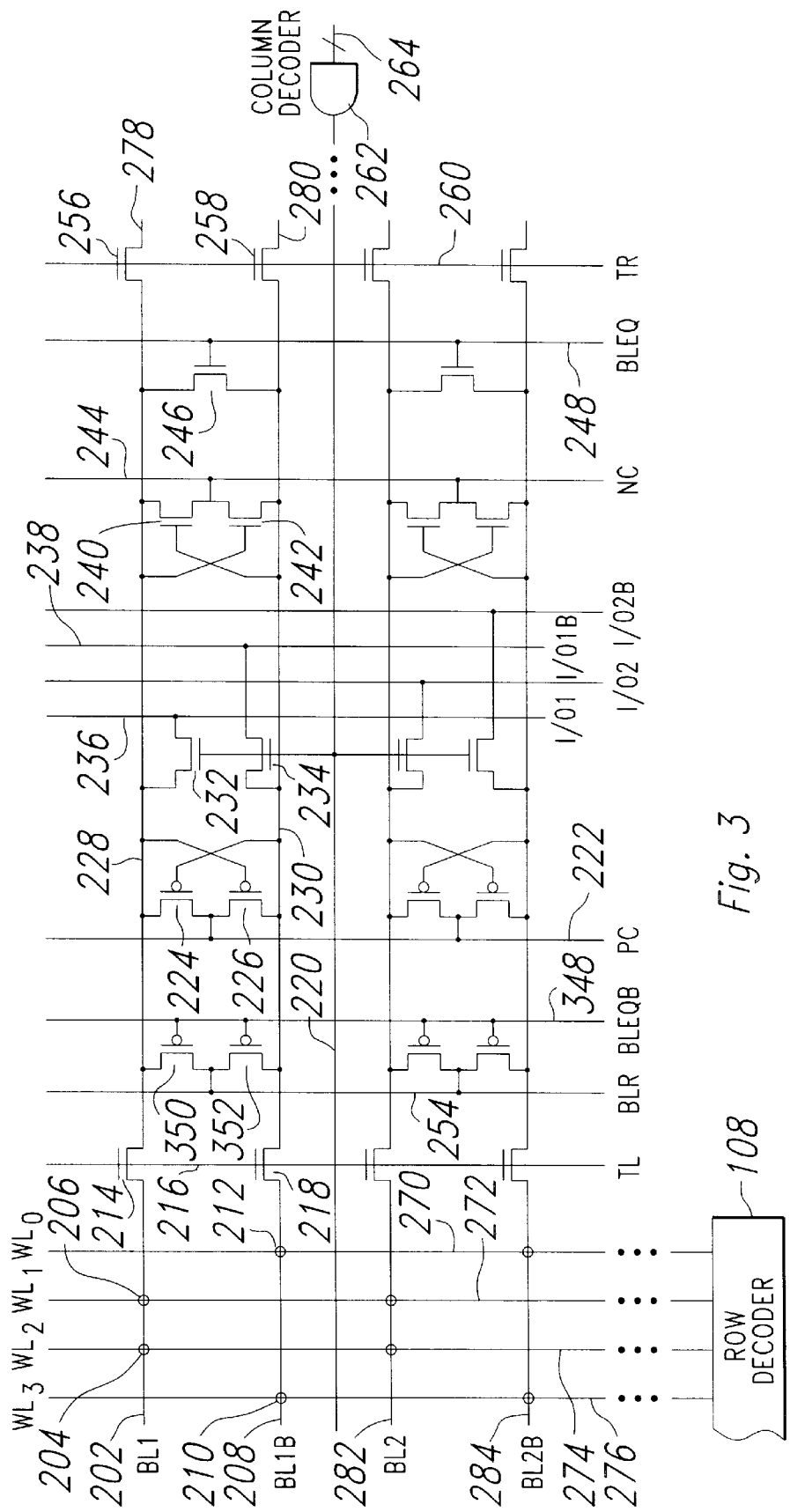
FIG. 3 is a schematic diagram of a sense amplifier circuit including a precharge circuit of an embodiment of the present invention.

Referring now to FIG. 3, there is a bit line precharge circuit of the present invention for reducing current flow through a word line to bit line short. The same reference numerals are used where the function of the circuit corresponds to the circuit of FIG. 2. For example, an N-channel equalization transistor 246 couples sense node 228 to sense node 230 during standby. However, P-channel transistors 350 and 352 precharge sense nodes 228 and 230 to bit line reference voltage BLR in response to control signal BLEQB at 348 during standby. This circuit offers several advantages over the precharge circuit of the prior art as will be explained in detail.

Figure 4:
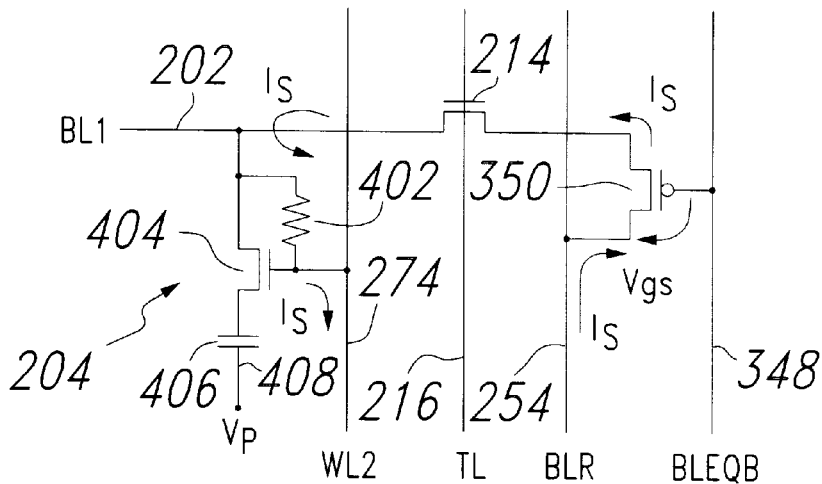
FIG. 4 is a simplified schematic diagram of a memory cell with a word line to bit line short showing short circuit current path Is.

Referring now to FIG. 4, there is a simplified schematic diagram of a memory cell 204 with a word line to bit line short 402 showing a short circuit current path Is. According to an embodiment of the present invention, P-channel precharge transistor 350 is turned off for a time t1–t5 of an active part of a memory cycle by control signal BLEQB at 348 (FIG. 5). Control signal BLEQB is driven low to reference voltage Vss for a time t5–t6 of a standby part of the memory cycle. This low voltage activates P-channel precharge transistor 350. During this first time, transistor 350 has a gate to source voltage Vgs approximately equal in magnitude to bit line reference voltage BLR. Thus, transistor 350 is highly conductive for normally precharging bit line BL1 at 202 in the absence of a bit line to word line short. For a time t6–t8, control signal BLEQB is driven to a voltage intermediate bit line reference voltage BLR and reference voltage Vss. This intermediate voltage for a second time is preferably one P-channel transistor threshold voltage below bit line reference voltage BLR. A one threshold voltage gate-to-source bias places precharge transistor 350 at a threshold of conduction. This threshold of conduction significantly reduces the magnitude of short circuit current Is through precharge transistor 350 for the remainder of the standby period. This reduction in short circuit current by precharge transistor 350 is almost independent of the resistance of short circuit resistance 402. Thus, an advantage of the present invention is that a memory circuit with a word line to bit line short will not fail due to excessive standby current ICC2 after redundant repair.

The precharge circuit of the present invention consisting of precharge transistors 350 and 352 does not increase the size of the sense amplifier. P-channel precharge transistors 350 and 352 may be combined in a common N-well region with cross-coupled P-channel transistors 224 and 226 (FIG. 3), thereby eliminating the need for two separate N-well regions and a requisite N+ to N-well space for each N-well region. A separate control signal BLEQB must be generated. The width of the BLEQB signal line, however, is less than a width required for precharge transistors 350 and 352. Thus, a further advantage of the present invention is that there is no increase in the size of the sense amplifier.

Figure 6:
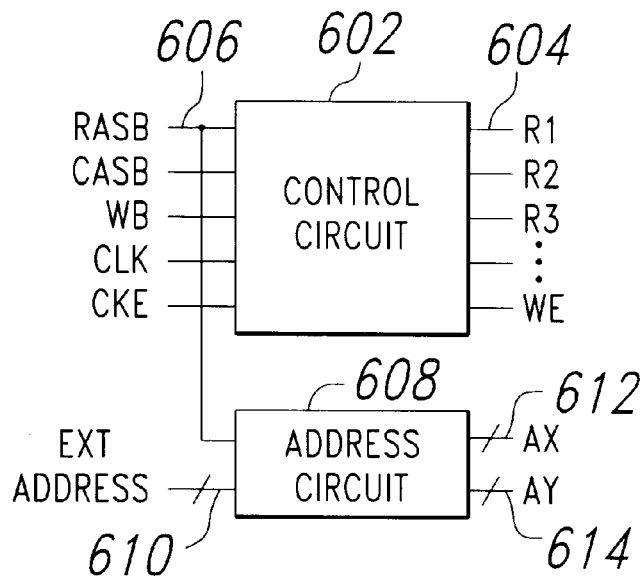
FIG. 6 is a block diagram of control and address circuits for the memory circuit of the present invention.

Referring now to FIG. 6, there is a block diagram of control and address circuits for the memory circuit of the present invention. External control signals RASB, CASB, WB, CLK and CKE are applied to the memory circuit in conjunction with external address signals at address bus 610. Control signal RASB at 606 is applied to address circuit 608 to multiplex the external addresses to row address bus 612 and column address bus 614. Control signal RASB is applied to control circuit 602 to produce a series of internal clock signals R1, R2 and R3 to control operation of the memory circuit. These internal clock signals generate proper timing edges for the wave forms of FIG. 5.

Figure 7:
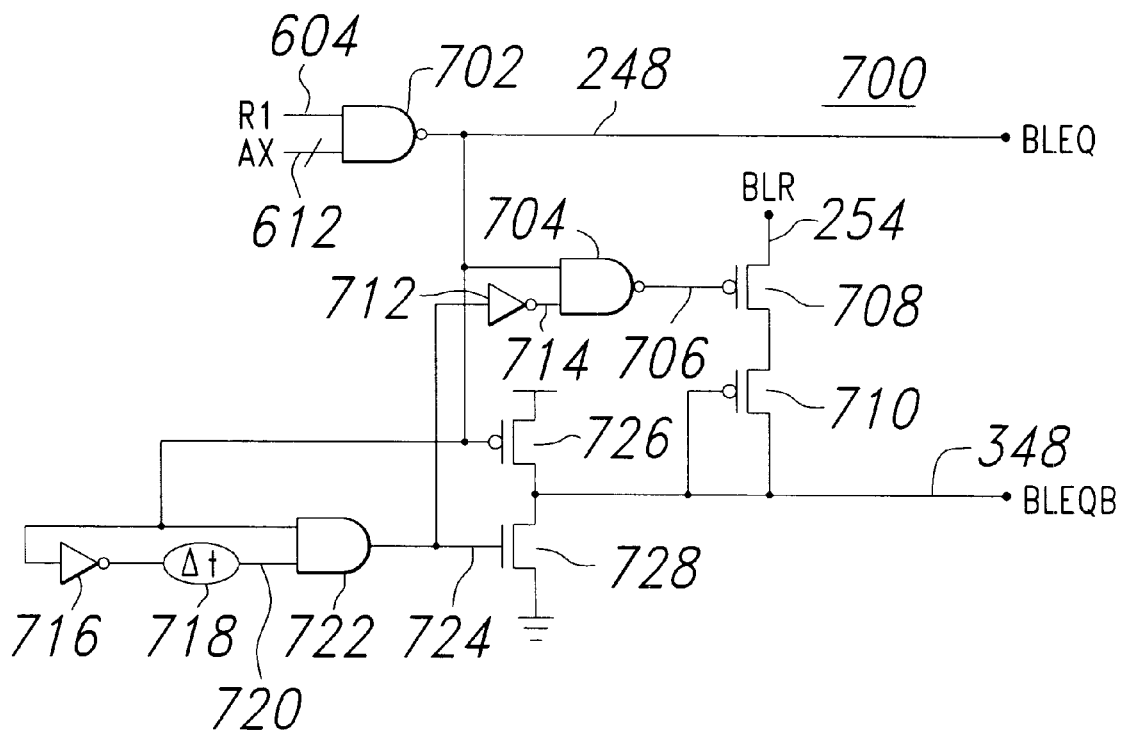
FIG. 7 is a schematic diagram of a control circuit for bit line precharge and equalization for the embodiment of FIG. 3 of the present invention.

Referring now to FIG. 7, there is a schematic diagram of a control circuit for bit line precharge and equalization for the embodiment of FIG. 3 of the present invention. Internal clock signal R1 at 604 (FIG. 6) and a part of address signal Ax at address bus 612 are applied to NAND gate 702 (FIG. 7) to generate equalization control signal BLEQ at 248 for a respective sense amplifier bank. An active cycle begins at time t0 when RASB goes low (FIG. 5). Control signal BLEQ goes low at time t1 in response to clock signal R1 and the part of address signal Ax. The output of NAND gate 704 at 706 goes high, thereby turning off transistor 708. The output of AND gate 722 at 724 goes low, thereby turning off transistor 728. Transistor 726 is activated and drives precharge control signal BLEQB at 348 to a level of supply voltage Vdd for time t1–t5 for the active part of the memory cycle.

Equalization control signal BLEQ goes high after the active part of the memory cycle at time t5 (FIG. 5). This transition turns off transistor 726 (FIG. 7). Input terminal 720 of AND gate 722 remains high due to a propagation delay of delay circuit 718. Thus, the output of AND gate 722 at terminal 724 goes high, thereby turning transistor 728 on and driving precharge control signal BLEQB to a level of reference voltage supply Vss. A low level output of inverter 712 at terminal 714 in response to the high level signal at terminal 724 maintains a high level signal at terminal 706. Thus, transistor 708 remains off for a first time t5–t6. During this first time, precharge transistors 350 and 352 are highly conductive and precharge sense nodes 228 and 230 to bit line reference voltage BLR (FIG. 3).

At a time t6, the high level of equalization control signal BLEQ propagates through inverter 716, delay circuit 718 and AND gate 722 to produce a low level output at terminal 724. Here, the delay period of delay circuit 718 may be selected by a predetermined number of series-connected inverters with distributed capacitive loads as is well known to those having ordinary skill in the art. This low level output at terminal 724 turns off transistor 728 and produces a high level output at terminal 714. This produces a low level output from NAND gate 704 at terminal 706, thereby turning on transistor 708. Transistor 708 applies bit line reference voltage BLR to terminal 348 through transistor 710. The common gate-drain or diode configuration induces a P-channel threshold voltage drop across transistor 710, thereby driving precharge signal BLEQB to a voltage intermediate bit line reference voltage BLR and reference voltage supply level Vss. This intermediate voltage level for the second time t6–t8 (FIG. 5) is preferably a P-channel threshold voltage drop below bit line reference voltage BLR until after time t7 when a new active part of a memory cycle begins. At a time t8, precharge control signal BLEQB goes high, thereby turning off precharge transistors 350 and 352 (FIG. 3). This third time, while precharge transistors 350 and 352 are off; corresponds to time t1–t5 of the previous cycle. Thus, conductivity of precharge transistors 350 and 352 is greatly reduced during the standby part of the memory cycle, thereby reducing standby current ICC2 for the memory circuit 100 due to a word line to bit line short.

Although the invention has been described in detail with reference to a preferred embodiment, it is to be understood that this description is by way of example only and is not to be construed in a limiting sense. For example, transistor 710 (FIG. 7) might be connected in series between bit line reference terminal 254 and transistor 708. This would only require a single transistor 710 for producing the P-channel voltage drop for all sense amplifier banks. Moreover, another embodiment of the present invention could use N-channel transistors with a separate precharge signal BLEQB. Then a circuit similar to that of FIG. 7 with complementary transistors would maintain precharge signal BLEQB at an N-channel transistor threshold voltage drop above bit line reference voltage BLR during the standby part of a memory cycle after time t6. Yet another embodiment of the present invention might use either N-channel or P-channel precharge transistors and simply turn them off at time t6 after they achieved a desired precharge level. Bit line equalization would be maintained during a standby part of a memory operation. The desired bit line precharge level would be restored when any row of memory cells in a respective memory array was refreshed, thereby eliminating any significant deviation in the bit line precharge voltage level during a standby part of a memory cycle. Finally, the present invention equally applicable to short circuit defects in other circuits, such as the sense amplifier, and even to other memory circuits, such as a static random access memory (SRAM) or an electrically erasable programmable read only memory (EEPROM).

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:
   a memory array having a plurality of memory cells arranged in rows and columns;
   a plurality of bit line pairs, each bit line pair connected to a respective column of memory cells;
   a bit line reference terminal;
   a control circuit for producing a first control signal, the first control signal having a first voltage for a first time, a second voltage different from the first voltage for a second time and a third voltage for a third time; and
   a precharge circuit for connecting at least one bit line pair to the bit line reference terminal, responsive to the first voltage for the first time and the second voltage for the second time, the precharge circuit disconnecting the at least one bit line pair from the bit line reference terminal, responsive to the third voltage for the third time.

2. A circuit as in claim 1, wherein the precharge circuit comprises a plurality of P-channel transistors, each P-channel transistor having a current path and a control gate, the current path coupling a respective bit line of the bit line pair to the bit line reference terminal, responsive to the first control signal applied to the control gate.

3. A circuit as in claim 2, wherein the first voltage is Vss, the third voltage is Vdd and the second voltage is approximately a threshold voltage of the P-channel transistor less than one half of Vdd.

4. A circuit as in claim 3, wherein the memory cells are dynamic random access memory cells.

5. A circuit as in claim 1, wherein the precharge circuit comprises a plurality of N-channel transistors, each N-channel transistor having a current path and a control gate, the current path coupling a respective bit line of the bit line pair to the bit line reference terminal, responsive to the first control signal applied to the control gate.

6. A circuit as in claim 5, wherein the first voltage is Vdd, the third voltage is Vss and the second voltage is approximately a threshold voltage of the N-channel transistor greater than one half of Vdd.

7. A circuit as in claim 6, wherein the memory cells are dynamic random access memory cells.

8. A memory circuit, comprising:
   a memory array having a plurality of memory cells arranged in rows and columns;
   a plurality of bit line pairs, each bit line pair connected to a respective column of memory cells;
   a control terminal for receiving a control signal, the control signal having a first logic state during an active part of a memory cycle and a second logic state during a standby part of the memory cycle;
   a bit line reference terminal;
   a control circuit for producing a first control signal and a second control signal;
   an equalization transistor having a current path and a control gate, the current path connected between bit lines of a respective bit line pair, the control gate coupled to receive the first control signal; and a precharge circuit for connecting with a first resistance the respective bit line pair to the bit line reference terminal for a first time in the standby part of the memory cycle and connecting with a second resistance different from the first resistance the respective bit line pair from the bit line reference terminal for a second time in the standby part of the memory cycle in response to the second control signal.

9. A circuit as in claim 8, wherein the memory cells are dynamic random access memory cells.

10. A circuit as in claim 9, wherein the equalization transistor is N-channel and the precharge circuit includes a pair of P-channel transistors, each P-channel transistor connecting a respective bit line to the bit line reference terminal in response to the second control signal.

11. A circuit as in claim 9, wherein the equalization transistor is N-channel and the precharge circuit includes a pair of N-channel transistors, each N-channel transistor connecting a respective bit line to the bit line reference terminal in response to the second control signal.

* * * * *

UNITED STATES PATENT AND TRADEMARK OFFICE
CERTIFICATE OF CORRECTION

PATENT NO : 5,995,431
DATED : November 30, 1999
INVENTOR(S) : Takashi Inui, Masahide Matsumoto, and Kiyotaka Okuzawa It is certified that an error appears in the above-identified patent and that said Letters Patent is hereby corrected as shown below:

On the cover page add under [22] Filed: June 10, 1998:

-- "Related U.S. Application Data"

[60] Provisional application No. 60/049,313, Jun. 11, 1997 --.

Signed and Sealed this

Eighteenth Day of July, 2000

Attest:

Attesting Officer

Q. TODD DICKINSON
Director of Patents and Trademarks